United States Patent
Ararao et al.

(10) Patent No.: US 8,207,598 B2
(45) Date of Patent: Jun. 26, 2012

(54) SEMICONDUCTOR PACKAGE HEAT SPREADER

(75) Inventors: Virgil Cotoco Ararao, Shrewsbury, MA (US); Il Kwon Shim, Singapore (SG); Seng Guan Chow, Singapore (SG); Sheila Marie L. Alvarez, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 12/498,163

(22) Filed: Jul. 6, 2009

(65) Prior Publication Data
US 2009/0273062 A1 Nov. 5, 2009

Related U.S. Application Data

(62) Division of application No. 10/721,916, filed on Nov. 24, 2003, now Pat. No. 7,575,956.

(51) Int. Cl.
*H01L 23/36* (2006.01)
(52) U.S. Cl. ........ 257/666; 257/675; 257/706; 257/720; 257/E23.101; 257/E23.114
(58) Field of Classification Search .................. 257/666, 257/675, 720, 717, 706, 796, E23.101, E23.114
See application file for complete search history.

(56) References Cited

U.S. PATENT DOCUMENTS

| | | | |
|---|---|---|---|
| 5,397,917 A | | 3/1995 | Ommen et al. |
| 6,008,991 A | * | 12/1999 | Hawthorne et al. ........... 361/707 |
| 6,118,177 A | | 9/2000 | Lischner et al. |
| 6,301,779 B1 | | 10/2001 | Azar |
| 6,351,385 B1 | | 2/2002 | Featherstone, III |
| 6,376,907 B1 | | 4/2002 | Takano et al. |
| 6,385,047 B1 | | 5/2002 | McCullough et al. |
| 6,397,941 B1 | | 6/2002 | McCullough |
| 6,538,320 B1 | | 3/2003 | Tosaya et al. |
| 7,005,738 B2 | | 2/2006 | Zuo et al. |
| 7,177,155 B2 | * | 2/2007 | Lin et al. ....................... 361/704 |

OTHER PUBLICATIONS

Webster's College Dictionary, Definition of "channel", Random House, New York, 1991, p. 226.

* cited by examiner

*Primary Examiner* — Thanh Nguyen
(74) *Attorney, Agent, or Firm* — Ishimaru & Associates LLP; Mikio Ishimaru; Stanley Chang (57) ABSTRACT

A semiconductor heat spreader from a unitary metallic plate is provided. The unitary metallic plate is formed into a panel, channel walls, at least two feet, and at least one external reversing bend. The channel walls depend from the panel to define a channel between the channel walls and the panel for receiving a semiconductor therein. The feet extend from respective channel walls for attachment to a substrate.

10 Claims, 10 Drawing Sheets

SEMICONDUCTOR PACKAGE HEAT SPREADER

CROSS-REFERENCE TO RELATED APPLICATION

This application is a divisional of U.S. patent application Ser. No. 10/721,916 filed Nov. 24, 2003, now U.S. Pat. No. 7,575,956, and the subject matter thereof is hereby incorporated herein by reference thereto.

TECHNICAL FIELD

The present invention relates generally to semiconductor heat dissipation, and more particularly to semiconductor package heat spreaders and methods for the fabrication thereof.

BACKGROUND ART

In the electronics industry, a continuing objective is to further and further reduce the size of electronic devices while simultaneously increasing performance and speed. Cellular telephones, personal data devices, notebook computers, camcorders, and digital cameras are but a few of the consumer products that require and benefit from this ongoing miniaturization of sophisticated electronics.

Integrated circuit ("IC") assemblies for such complex electronic systems typically have a large number of interconnected IC chips. The IC chips are usually made from a semiconductor material such as silicon or gallium arsenide. Photolithographic techniques are used to form the various semiconductor devices in multiple layers on the IC chips.

After manufacture, the IC chips are typically incorporated into packages that may contain one or several such chips. The semiconductor device chip is mounted on the surface of a substrate, for example by means of a layer of epoxy. Gold bond wires can connect electrical contact points on the upper surface of the device to the substrate. Contact balls can also be provided on the lower surface of the device for additional connections between the device and the substrate. A molding compound is used to encapsulate the die and the bond wires, providing environmental protection for the die and defining the semiconductor chip package. These chip packages or modules are then typically mounted on printed circuit wiring boards.

In conventional multi-chip modules, a number of semiconductor devices are mounted in close proximity within a single package. This eliminates separate packages for each of the semiconductor devices, improves electrical performance, and reduces the overall board space occupied by the devices.

Due to the increase in the packing density, however, the power density (the heat output concentration) of such a multi-chip module is typically higher than when the chips are separately packaged. This requires more elaborate designs for thermal management to keep the device temperatures within acceptable ranges.

In conventional multi-chip modules, the devices are connected to a substrate, and electrical connections among the devices are accomplished within the substrate. One of the technologies used to connect the devices to the substrate is called "flip chip" or face down bonding, and employs the well-known controlled collapse chip connection (or "C4") bonding technology. With this technology, solder bumps are first formed at the chip terminals. Subsequently, the semiconductor devices are flipped over onto the substrate and the solder bumps are melted to connect to corresponding terminal pads on the substrate.

Heat management through such a structure can be critical. The internal thermal resistance and thermal performance of the flip chip interconnect technology are determined by a series of heat flow paths. By making high heat conductivity connections between the bottom of the die and the substrate, heat generated in the die can be transferred efficiently from the die to the substrate.

For applications where additional heat must be removed from the semiconductor die, the molding compound that encapsulates the die can be partially omitted from the upper surface of the die to partially expose this surface. The exposed die surface can then be put in direct physical contact with a heat spreader that overlies the semiconductor die. To enhance the cooling performance, a layer of thermal grease or the like can be spread between the die surface and the heat spreader to improve heat transfer to the heat spreader.

The heat spreader is typically formed so that it can also be attached to the underlying substrate, resulting in a mechanically strong package. Where necessary, the heat spreader can also be encapsulated in a molding compound that is formed overlying the upper surface of the package.

The heat thus flows first from the semiconductor device to the body of the semiconductor module or package into which it has been incorporated, and then to the package surface and to the heat spreader that is attached to the package surface. Unfortunately, there are drawbacks associated with the use of known heat spreaders for flip chip and other semiconductor packages. Among these drawbacks are heat spreader manufacturing costs, complicated assembly processes, and concerns about package reliability. These drawbacks can be understood, for example, by considering common prior art two-piece and single-piece structures.

One such heat spreader structure is a two-piece configuration having a stiffener with a hollow core that surrounds the flip chip, and a metal lid cover that is on top of the stiffener and the flip chip. Often, the stiffener is thicker than the metal lid. Two different metal forming processes are then required to fabricate the two different pieces of the heat spreader from two different raw metal sheets of two different thicknesses. Furthermore, assembly of a two-piece heat spreader is expensive and complicated since two layers of adhesive must be separately and carefully applied: one between the substrate and the stiffener, and a second between the stiffener and the metal lid.

In another prior art heat spreader structure, a hollow cavity and a lid are formed as a single piece. To form the cavity therein for the chip, a rather thick metal sheet needs to be used, and a substantial amount of material then needs to be removed to form the chip cavity. Thus, costly metal forming processes, like milling or casting, have to be employed to fabricate this type of heat spreader.

Consequently, there still remains a need for improved, more economical, more efficient, and more readily manufactured and assembled heat spreaders, heat spreader packages, and fabrication methods for use with flip chip semiconductor devices.

Solutions to these problems have been long sought but prior developments have not taught or suggested any solutions and, thus, solutions to these problems have long eluded those skilled in the art.

DISCLOSURE OF THE INVENTION

The present invention provides a semiconductor heat spreader from a unitary metallic plate. The unitary metallic plate is formed into a panel, channel walls, at least two feet, and at least one external reversing bend. The channel walls depend from the panel to define a channel between the channel walls and the panel for receiving a semiconductor therein. The feet extend from respective channel walls for attachment to a substrate.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the FIGs. Also, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the semiconductor heat spreader, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 1:
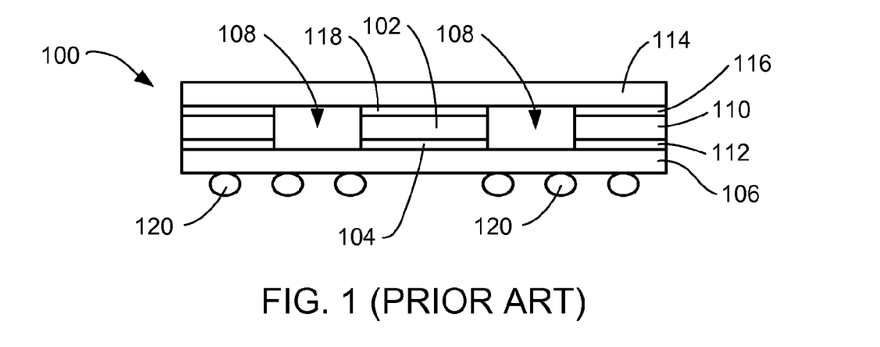
FIG. 1 (PRIOR ART) is a figurative side view of a prior art heat spreader containing a semiconductor package.

Referring now to FIG. 1 (PRIOR ART), therein is shown a somewhat figurative side view of a prior art two-piece heat spreader 100. A semiconductor package 102 is attached by an adhesive layer 104 to a substrate 106. The semiconductor package 102 is located within an open core 108 of a hollow core stiffener 110. The hollow core stiffener 110 is also attached, by an adhesive layer 112, to the substrate 106. A heat spreader plate 114 that is separate from the hollow core stiffener 110 is located above the hollow core stiffener 110 and the semiconductor package 102. The heat spreader plate 114 is attached to the hollow core stiffener 110 by an adhesive layer 116.

A thermal interface material layer 118 contacts and is located between the semiconductor package 102 and the heat spreader plate 114. A conventional ball grid array ("BGA") 120 of minute solder balls is disposed on the opposite attachment surface of the substrate 106 for attaching and electrically connecting the substrate 106 to another substrate or circuit.

The prior art heat spreader 100 thus requires two different metal forming processes to fabricate the hollow core stiffener 110 and the heat spreader plate 114. Assembly of the prior art heat spreader 100 onto and around the semiconductor package 102 is a labor intensive, costly, and complicated process. It requires double adhesive dispensing (for the adhesive layers 112 and 116) and separate application and positioning of the hollow core stiffener 110 and the heat spreader plate 114. This results in a low units per hour ("UPH") process.

Figure 2:
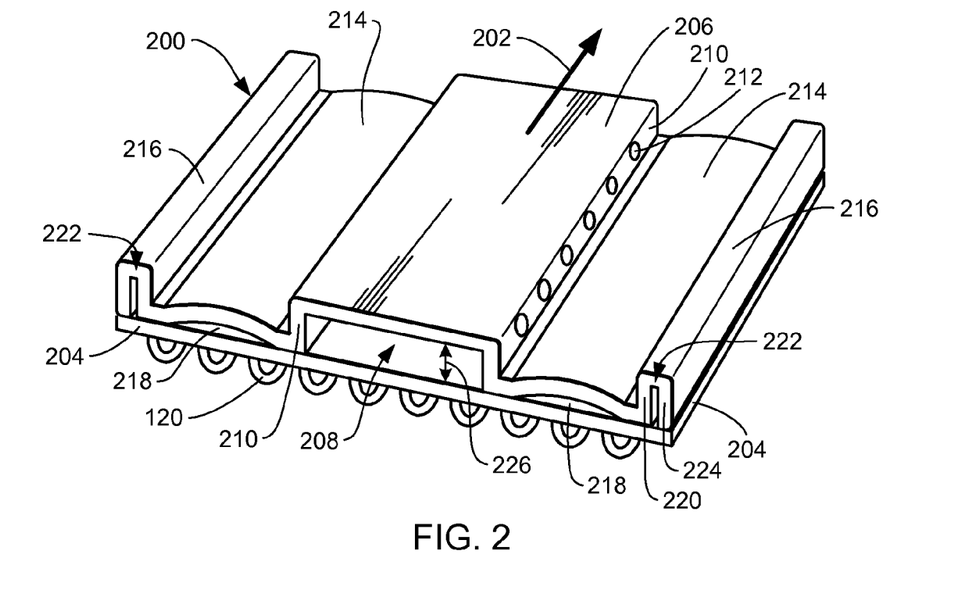
FIG. 2 is a view of a heat spreader in accordance with the present invention.

Referring now to FIG. 2, therein is shown a heat spreader 200 according to the present invention. The heat spreader 200 is formed from a single metallic plate, preferably copper (Cu). As can be seen in FIG. 2, the cross-sectional profile of the heat spreader 200 in one dimension (horizontally transversely as depicted in FIG. 2) is constant and does not change in the horizontal direction perpendicular thereto, depicted by an arrow 202. This provides for highly efficient and inexpensive fabrication of the heat spreader, such as by continuous metal forming and/or extruding operations. A large number of such heat spreaders can thus be formed in a single metal stamping, continuous metal forming, and/or extruding operation from a single, unitary piece of metallic material such as a metallic Cu sheet.

Heat spreaders, such as the heat spreader 200, that are thus formed in a single metal stamping, continuous metal forming, and/or extruding operation ("unitary metal forming") will have characteristic physical properties in the final product that are a result of such unitary forming processes. Examples of such known physical characteristics from unitary metal forming operations include: surface scoring, surface hardness variations, bend stresses, inelastic deformations of the metal, and so forth. These physical characteristics can be easily determined and observed by known and conventional analytical techniques. As a consequence, heat spreaders according to the present invention that are formed in a single metal stamping and/or forming process will have the physical characteristics of being formed in a unitary metal forming process.

The heat spreader 200, which is shown mounted on a substrate 204, is shaped to define a panel 206 that is raised above the substrate 204 to define a channel 208 between the panel 206 and the substrate 204. The channel 208 can extend from an end of the substrate 204 to an opposite end of the substrate 204. Channel walls 210 depend from the panel 206, defining the sides of the channel 208, to contact the substrate 204 on each side of the channel 208. Optional through holes 212 in the channel walls 210 may be provided for stress relief.

Extending laterally from the channel walls 210 are arched feet 214 for attaching and securing the heat spreader 200 to the substrate 204. The arched feet 214, in this embodiment, terminate opposite the channel 208 in reinforcing channels 216 that help to stiffen and reinforce the arched feet 214 to retain the shape thereof.

To secure the heat spreader 200 to the substrate 204, an adhesive 218, preferably a thermal adhesive, is located within and beneath the arched feet 214, between the arched feet 214 and the substrate 204. The adhesive 218 can be applied in discreet quantities, such as large-size "dots", to achieve high UPH, or the adhesive may be applied through line dispensing for better thermal conductivity. As can be seen, the feet are formed in the arched shape to provide hollows beneath the arches of the feet to accommodate respective volumes of the adhesive 218 therebeneath. The height of the arches is set in order to maintain a desired thickness of the adhesive 218.

The heat spreader 200 includes one or more "external" reversing bends outside of and separate from the channel 208. These reversing bends are formed in the single metallic plate from which the heat spreader 200 is formed, and enable the features of the heat spreader to be integrated thereinto in such a unitary forming process on a single metallic plate. It also affords structural advantages such as increased strength and increased bending resistance.

An example of an external reversing bend in the heat spreader 200 may be seen in the reinforcing channels 216. Thus, an upward trace starting at an inner wall 220 of either of the reinforcing channels 216 will pass through a reversing bend 222 therein and continue in the reverse, or downward, direction in an outer wall 224 of the reinforcing channel 216. That is, the trace continues in the reverse direction, opposite to the initial trace direction.

Thus, the term "external reversing bend" will be seen and understood to refer to a reversing bend that is outside of and external to the portions of the heat spreader that immediately define the semiconductor receiving channel, such as the channel 208, in a heat spreader according to the present invention.

The channel 208, defined by the channel walls 210 and the panel 206, forms a semiconductor receiving channel having a set height 226 appropriate for receiving a semiconductor (not shown) therein. (But see, for example, FIG. 17, which shows such a semiconductor 102 in a like semiconductor receiving channel.)

For connecting the semiconductor to external circuitry in known fashion, a conventional BGA 120 is disposed on the surface of the substrate 204 opposite the heat spreader 200.

Figure 3:
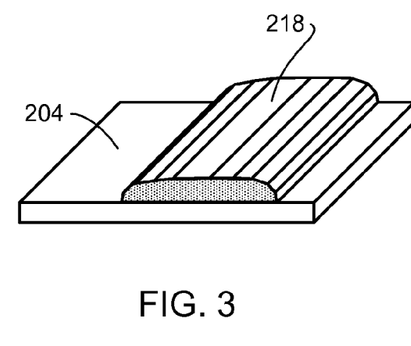
FIG. 3 is a depiction of the application of adhesive by line dispensing onto a substrate.

Referring now to FIG. 3, therein is depicted the application of the adhesive 218, by line dispensing, onto the substrate 204. The adhesive 218 is dispensed in this manner prior to positioning the heat spreader 200 thereon.

Figure 4:
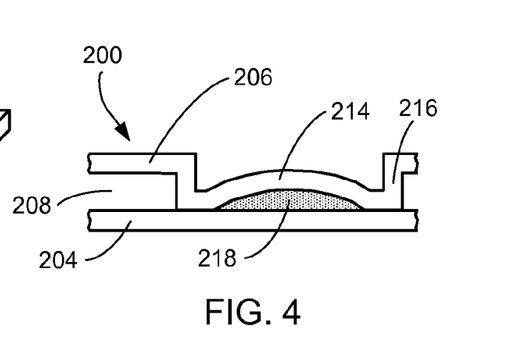
FIG. 4 is a fragmentary end view of the heat spreader of FIG. 2 attached to a substrate.

Referring now to FIG. 4, therein is shown a fragmentary end view of the heat spreader 200 of FIG. 2 following attachment thereof to the substrate 204 by the adhesive 218. Channel walls 210, of FIG. 2, depend vertically from the panel 206 defining the channel 208 having the set height 226, of FIG. 2, as measured along the channel walls 210. The set height 226 is measured from the lower surface of the panel 206 to the substrate 204 through the channel 208.

Figure 5:
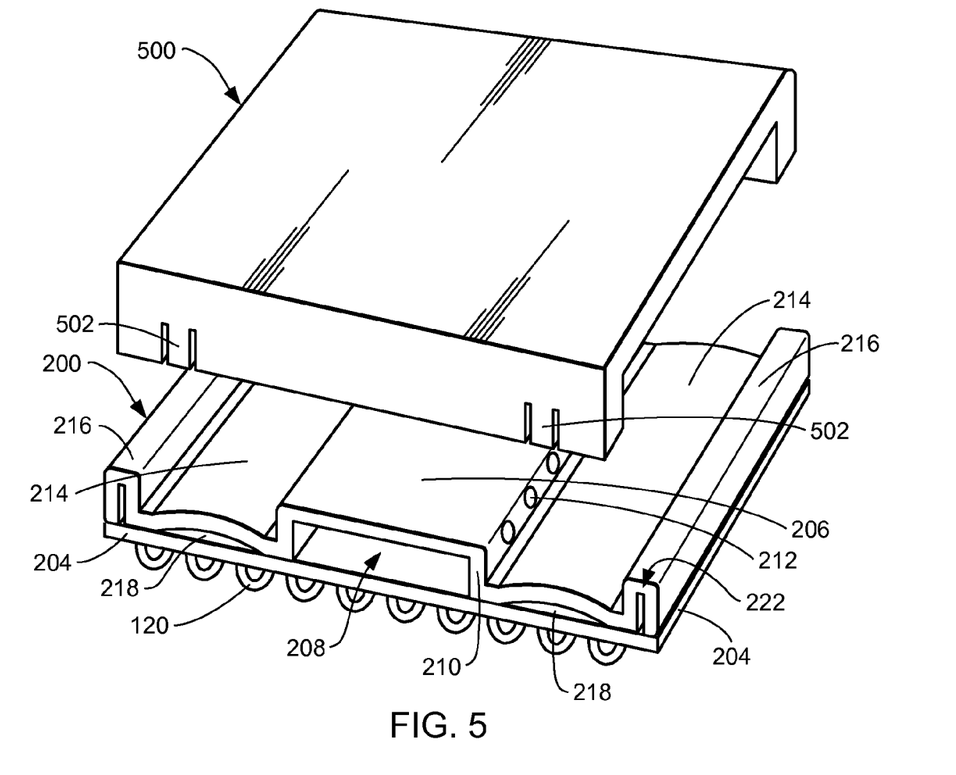
FIG. 5 is a view of an auxiliary heat spreader formed to fit over the heat spreader of FIG. 2.

Referring now to FIG. 5, therein is shown an auxiliary heat spreader 500 that is formed to fit over the heat spreader 200. The auxiliary heat spreader 500 forms an electromagnetic interference ("EMI") shield (also known as a Faraday cage). It also helps to increase the heat transfer capability and performance of the heat spreader 200.

The auxiliary heat spreader 500 is a unitary auxiliary heat spreader that is formed from an additional unitary metallic plate in substantially a single metal forming process that configures it for attachment on top of the heat spreader 200. The auxiliary heat spreader 500, the top surface of which can be used as a marking area, includes attachment means such as locking tabs 502 that are positioned thereon to engage underneath the arched feet 214 when the auxiliary heat spreader 500 is positioned immediately on top of the heat spreader 200. When thus positioned, the locking tabs 502 are pressed (deformed or bent) inwardly and underneath the arched feet 214 to lock the auxiliary heat spreader 500 in position on the heat spreader 200.

Figure 6:
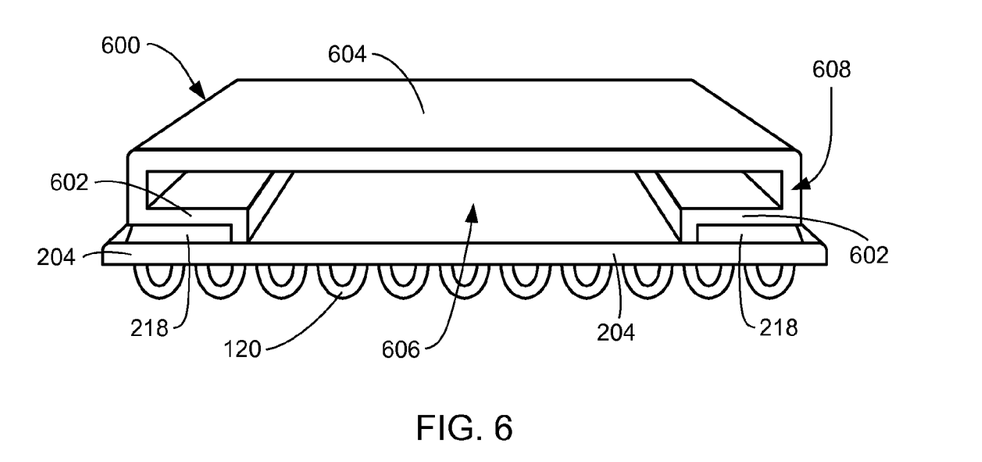
FIG. 6 is a view of a heat spreader having stand-off feet.

Referring now to FIG. 6, therein is shown a heat spreader 600 having stand-off feet 602 attached to the substrate 204 by the adhesive 218. Similarly as the heat spreader 200 (FIG. 2), the heat spreader 600 is formed in a single metal stamping and forming process from a single, unitary piece of metallic material such as a metallic Cu sheet.

The heat spreader 600 provides a panel 604 supported by and above the stand-off feet 602 to define a channel 606 therebeneath and between the stand-off feet 602. The channel 606 is for receiving therewithin a semiconductor device, such as the semiconductor package 102 (not shown, but see FIG. 17), that is supported by and attached to the substrate 204. The adhesive 218, as previously described (see FIG. 3) is applied by line dispensing, although other application techniques, such as the dispensing of large-size dots, may be used as appropriate. The dimensions of the stand-off feet 602 are set to maintain a desired thickness of the adhesive 218.

The portions of the heat spreader 600 from the edges of the panel 604 around and into the stand-off feet 602 will be seen to form external reversing bends 608 in the heat spreader 600.

Figure 7:
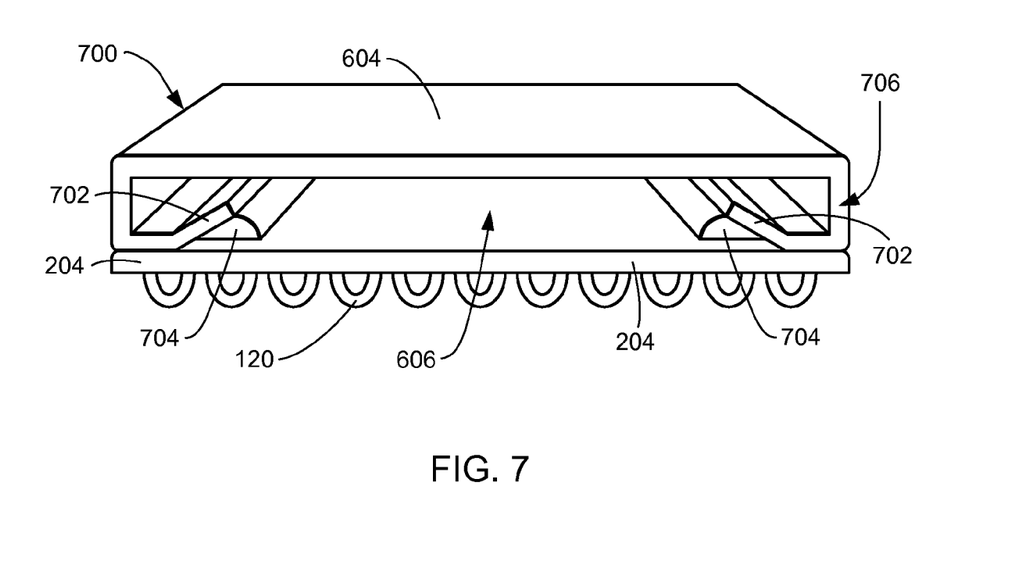
FIG. 7 is a view of a heat spreader having toed feet.

Referring now to FIG. 7, therein is shown a heat spreader 700 similar to the heat spreader 600 (FIG. 6), except that the heat spreader 700 is provided with toed feet 702. The toed feet 702 are attached to the substrate 204 by an adhesive 704 similar to the adhesive 218 (FIGS. 3 and 6), except that the width of the line dispensing for the adhesive 704 is narrower than that depicted in FIG. 3 for the adhesive 218. The dimensions of the toed feet 702 are set to maintain a desired thickness of the adhesive 704. The portions of the heat spreader 700 from the edges of the panel 604 around and into the toed feet 702 form external reversing bends 706 in the heat spreader 700.

Figure 8:
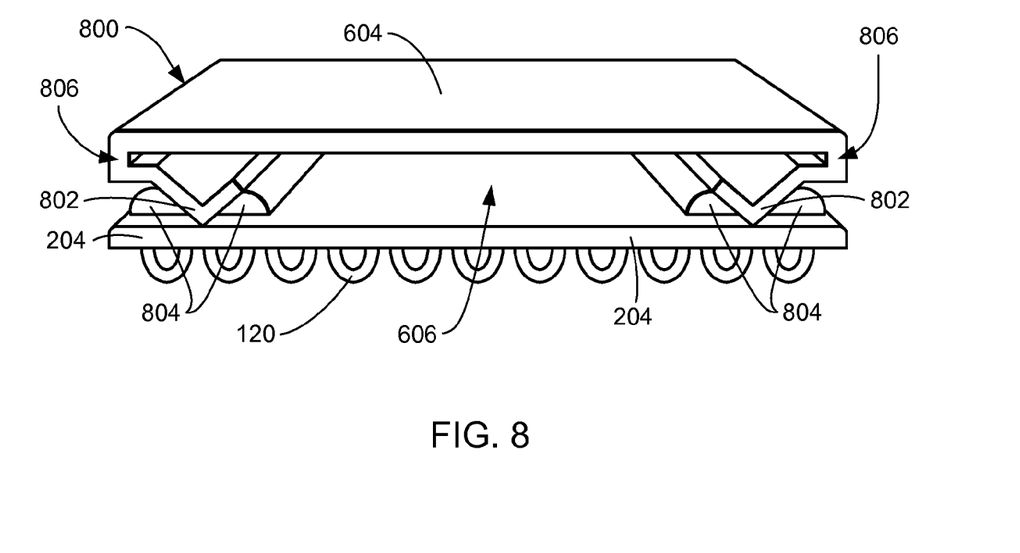
FIG. 8 is a view of a heat spreader having stand-off toed feet.

Referring now to FIG. 8, therein is shown a heat spreader 800 similar to the heat spreaders 600 (FIG. 6) and 700 (FIG. 7), except that the heat spreader 800 has stand-off toed feet 802. The heat spreader 800 is attached to the substrate 204 by an adhesive 804 that is applied by line dispensing a single line of adhesive for each of the stand-off toed feet 802. Then, when the heat spreader 800 is positioned onto the substrate 204, each of the stand-off toed feet 802 presses into the adhesive 804, bisecting each of the line-dispensed adhesive strips as illustrated in FIG. 8, and securing the stand-off toed feet 802 to the substrate 204. The dimensions of the stand-off toed feet 802 are set to maintain a desired thickness of the adhesive 804.

It will also be seen that the portions of the heat spreader 800 external to the channel 606, from the edges of the panel 604 around and into the stand-off toed feet 802, again form external reversing bends 806 in the heat spreader 800.

Figure 9:
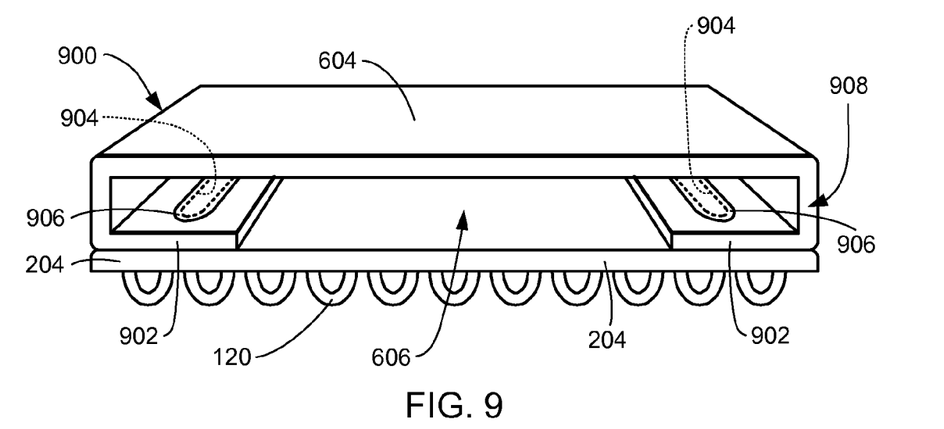
FIG. 9 is a view of a heat spreader having slotted flat feet.

Referring now to FIG. 9, therein is shown a heat spreader 900 similar to the heat spreaders illustrated in FIGS. 6-8, except that the heat spreader 900 has slotted flat feet 902. A slot 904 extending along and through the slotted flat foot 902 receives therein and therethrough an adhesive 906 (see also FIG. 10) to secure the heat spreader 900 to the substrate 204. The adhesive 906 may be applied to the substrate 204 by line dispensing, following which the slotted flat feet 902 are pressed into the adhesive 906 to force the adhesive 906 into the slots 904 and secure the heat spreader 900 onto the substrate 204. The dimensions of the slots 904 are set to maintain a desired quantity and extent of the adhesive 906.

The heat spreader 900 has external reversing bends 908 therein similar to the external reversing bends 706 (FIG. 7).

Figure 10:
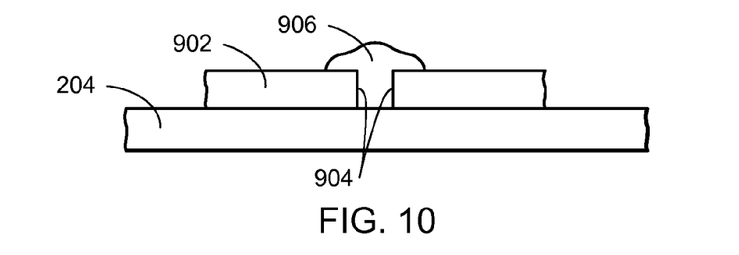
FIG. 10 is a partial cross-sectional view of the heat spreader shown in FIG. 9.

Referring now to FIG. 10, therein is shown a partial cross-sectional view of the heat spreader 900 and the substrate 204 as illustrated in FIG. 9, taken through one of the slots 904.

Figure 11:
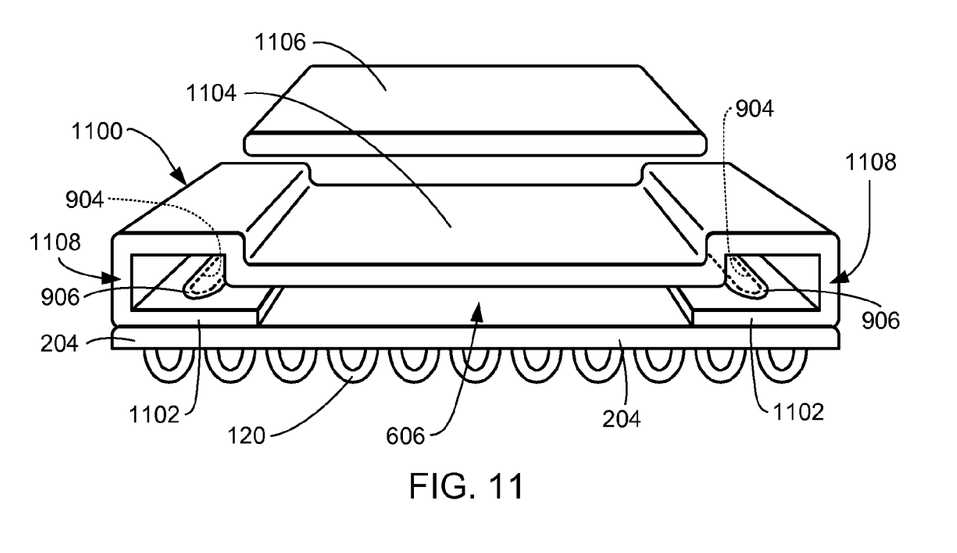
FIG. 11 is a view of a heat spreader having a depressed panel in the center thereof.

Referring now to FIG. 1, therein is shown a heat spreader 1100 similar to the heat spreader 900 (FIG. 9) and similarly having slotted flat feet 1102. However, the heat spreader 1100 has a depressed panel 1104 in the center thereof that defines a basin into which an auxiliary heat spreader 1106 can be received. The auxiliary heat spreader 1106 enhances the ability of the heat spreader 1100 to remove heat from semiconductor devices (not shown) located in the channel 606 between the depressed panel 1104 and the substrate 204 thereebeneath.

As before, the heat spreader 1100 has external reversing bends 1108 therein, in this case similar to the external reversing bends 706 (FIG. 7) and 908 (FIG. 9).

Figure 12:
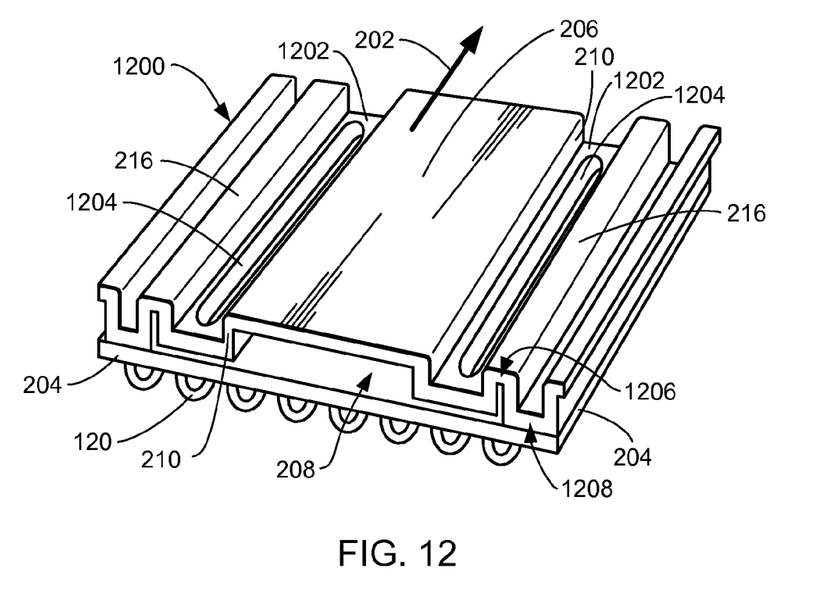
FIG. 12 is a view of a heat spreader having slotted stand-off feet.

Referring now to FIG. 12, therein is shown a heat spreader 1200 having slotted stand-off feet 1202. Similarly as the stand-off feet 602 (FIG. 6), the slotted stand-off feet 1202 are spaced slightly apart from the substrate 204 to accommodate an adhesive (not shown) that attaches the heat spreader 1200 to the substrate 204. Each of the slotted stand-off feet 1202 has a slot 1204 therethrough to receive adhesive and thereby enhance the adhesion of the heat spreader 1200 to the substrate 204. The slots 1204 thus function in a similar manner to the slots 904 (FIGS. 9 and 10).

The heat spreader 1200 has several types of reversing bends therein external to the channel 208, such as upper and lower external reversing bends 1206 and 1208 located toward the edges of the heat spreader.

Figure 13:
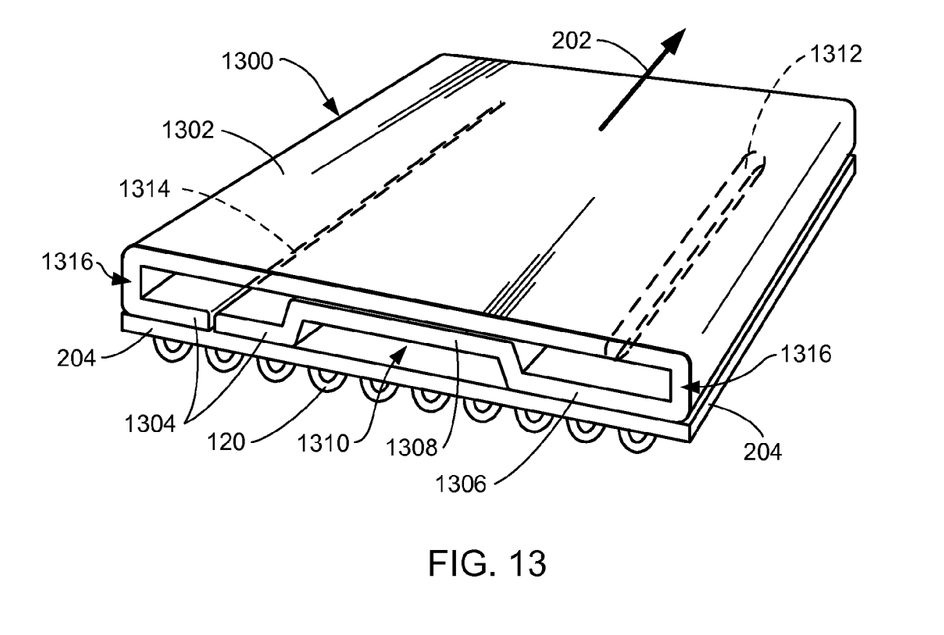
FIG. 13 is a view of a heat spreader having an integral auxiliary heat spreader formed across the top thereof.

Referring now to FIG. 13, therein is shown a heat spreader 1300. The heat spreader 1300 is formed from a single, unitary metallic plate like the heat spreaders described above in FIGS. 2 and 6. Additionally, the heat spreader 1300 includes an integral auxiliary heat spreader 1302 formed across the top thereof. Thus, the heat spreader 1300 includes a flat foot 1304 on one side, a flat foot 1306 on the opposite side, and a raised panel 1308 supported and connected therebetween. A channel 1310 is defined beneath the raised panel 1308 and above the substrate 204 on which the heat spreader 1300 is mounted and attached by the flat feet 1304 and 1306. The integral auxiliary heat spreader 1302 is thus formed integrally of the same unitary metallic plate that forms the raised panel 1308 and the rest of the heat spreader 1300, and is configured to be located on top of the raised panel 1308.

To accommodate adhesive (not shown) and enhance the attachment of the heat spreader 1300 to the substrate 204, the flat foot 1306 is provided with a slot 1312. The opposite flat foot 1304 contains a seam 1314 therein defined by the opposite ends of the unitary metallic plate from which the heat spreader 1300 was formed. The seam 1314 accommodates adhesive for the flat foot 1304 similarly as the slot 1312 accommodates adhesive for the flat foot 1306. The dimensions of the slot 1312 and the seam 1314 are set to maintain a desired quantity and extent of adhesive.

The portions of the heat spreader 1300 along the sides thereof that connect the integral auxiliary heat spreader 1302 to the flat feet 1304 and 1306 form external reversing bends 1316 therein.

Figure 14:
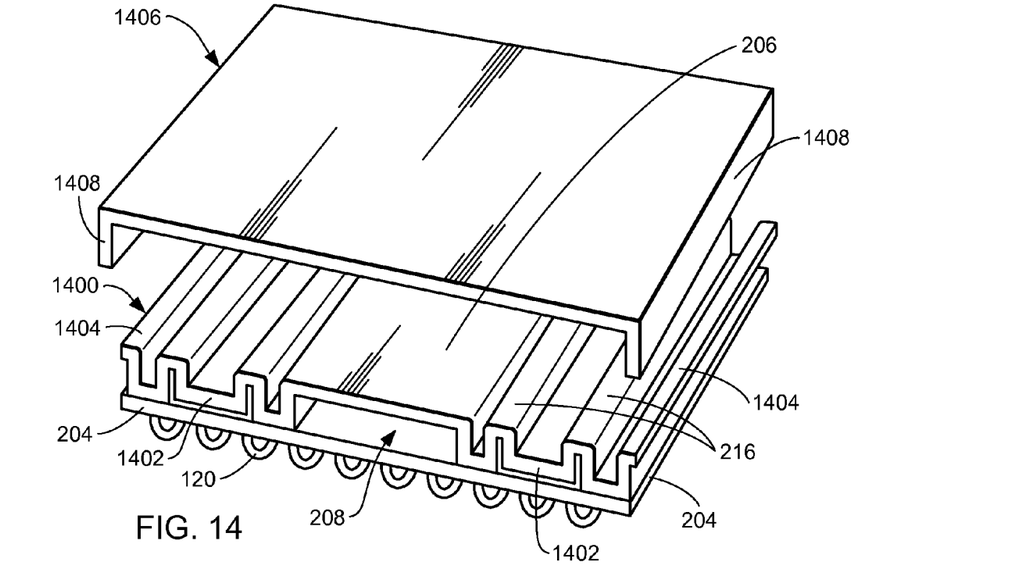
FIG. 14 is a view of a heat spreader having stand-off feet with side ledges.

Referring now to FIG. 14, therein is shown a heat spreader 1400 having stand-off feet 1402 with side ledges 1404 protruding away therefrom. An auxiliary heat spreader 1406 has deformable sides 1408 that can be bent or deformed by pushing inwardly, when the auxiliary heat spreader 1406 is positioned on top of the heat spreader 1400, to engage the side ledges 1404 and thus secure the auxiliary heat spreader 1406 on top of the heat spreader 1400.

Figure 15:
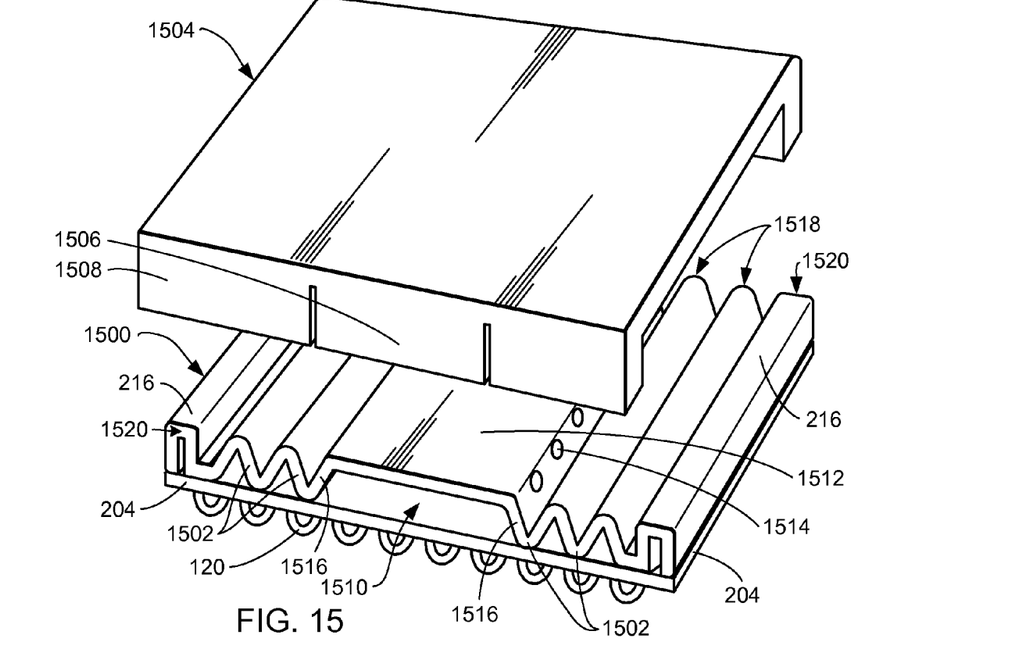
FIG. 15 is a view of a heat spreader having zigzag feet.

Referring now to FIG. 15, therein is shown a heat spreader 1500 having zigzag feet 1502. The zigzag feet 1502 are secured to the substrate 204 by an adhesive (not shown) in a manner similar to the stand-off toed feet 802 (FIG. 8). The dimensions of the zigzag feet 1502 are set to maintain a desired quantity and extent of adhesive.

The heat spreader 1500 includes an auxiliary heat spreader 1504 that has locking tabs 1506 formed on the sides 1508 of the auxiliary heat spreader 1504. The auxiliary heat spreader 1504 forms an EMI shield (Faraday cage), as well as helping to increase the heat transfer capability and performance of the heat spreader 1500.

To secure and lock the auxiliary heat spreader 1504 onto the heat spreader 1500, the auxiliary heat spreader 1504 is properly positioned on top of the heat spreader 1500. The locking tabs 1506 are then bent or deformed into the channel 1510 beneath the panel 1512 of the heat spreader 1500.

The heat spreader 1500 also includes through holes 1514 in channel walls 1516 depending from and connecting the panel 1512 to the zigzag feet 1502. The through holes 1514 provide stress relief similarly as the through holes 212 (FIG. 2), and can assist with heat removal from the channel 1510.

The heat spreader 1500 additionally includes several external reversing bends, such as the external reversing bends 1518 in the zigzag feet 1502 and the external reversing bends 1520 in the reinforcing channels 216 of the heat spreader 1500.

Figures 16, 17:
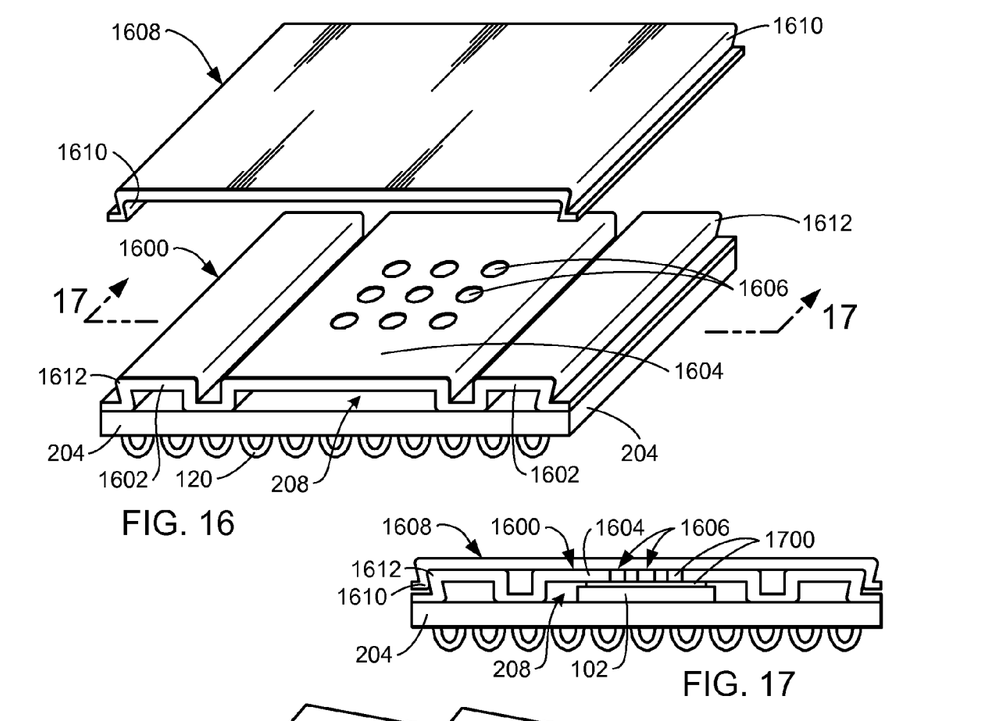
FIG. 16 is a view of a heat spreader having box feet.
FIG. 17 is a cross-sectional view, taken generally on line 17-17 in FIG. 16, of the heat spreader and the clip-attach auxiliary heat spreader of FIG. 16 in a snapped or clipped together configuration.

Referring now to FIG. 16, therein is shown a heat spreader 1600 having box feet 1602 on each side thereof. The heat spreader 1600 has a panel 1604 provided with through holes 1606 to assist heat removal therefrom. To augment heat removal even further from the heat spreader 1600, a clip-attach auxiliary heat spreader 1608 is also provided for the heat spreader 1600. The clip-attach auxiliary heat spreader 1608 includes side clips 1610 that are adapted to clip onto clip bosses 1612 that are formed along the upper edges of the box feet 1602. This provides for snapping or clipping the clip-attach auxiliary heat spreader 1608 onto the heat spreader 1600.

Referring now to FIG. 17, therein is shown a cross-sectional view, taken generally on line 17-17 in FIG. 16, of the heat spreader 1600 and the clip-attach auxiliary heat spreader 1608 in their snapped or clipped-together configuration. The substrate 204 is shown with a semiconductor package 102 supported thereon beneath the panel 1604 of the heat spreader 1600. The channel 208 has a set height appropriate for receiving such a semiconductor 102 therein and accommodating a thermal interface material 1700 that is located between the semiconductor package 102 and the panel 1604, and in the through holes 1606. The thermal interface material 1700, in known fashion, enhances heat transfer between the semiconductor package 102, the panel 1604, and the clip-attach auxiliary heat spreader 1608.

Figure 18:
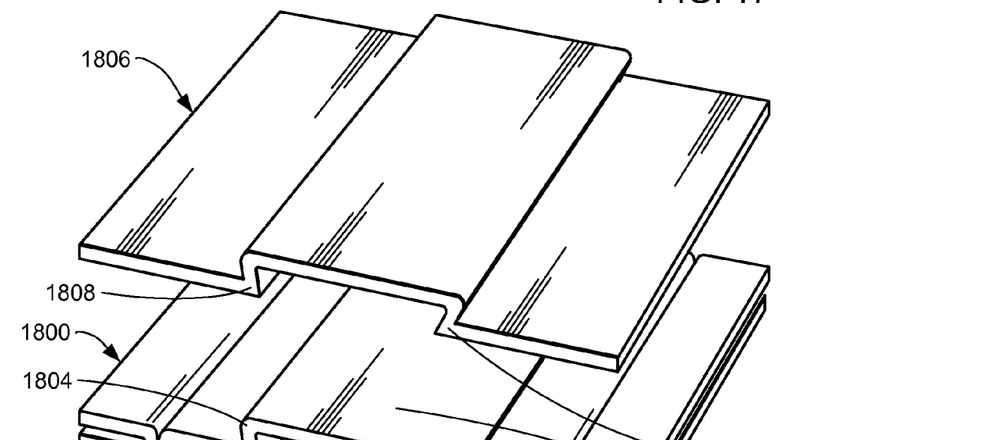
FIG. 18 is a view of a heat spreader with a panel having edges formed into clip bosses.

Referring now to FIG. 18, therein is shown a heat spreader 1800 having a panel 1802, the edges of which are formed into clip bosses 1804. A clip-attach auxiliary heat spreader 1806, formed from a single, unitary piece or plate of metallic material such as a metallic Cu sheet, has center clips 1808 therein to compliment the clip bosses 1804. The center clips 1808 are then clipped onto the clip bosses 1804 to attach the clip-attach auxiliary heat spreader 1806 onto the heat spreader 1800 to augment the heat spreading capability thereof.

Figure 19:
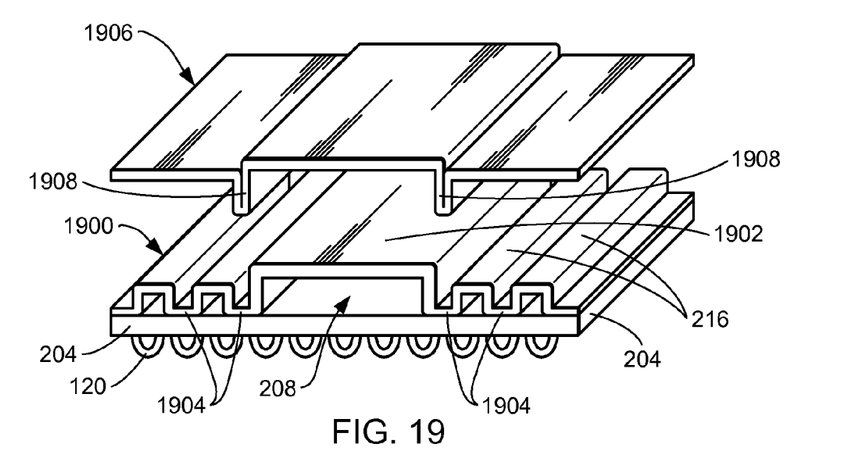
FIG. 19 is a view of a heat spreader with a panel flanked by box feet.

Referring now to FIG. 19, therein is shown a heat spreader 1900 formed from a single plate of metallic material. The heat spreader 1900 has a panel 1902 that is flanked by pairs of box feet 1904. A grip-attach auxiliary heat spreader 1906, also formed from a single plate of metallic material, is designed and dimensioned to attach to the heat spreader 1900 by gripping the panel 1902 at the sides thereof. More particularly, the grip-attach auxiliary heat spreader 1906 has side arms 1908 formed and extending downwardly thereon that are separated by a distance just slightly less than the corresponding width of the panel 1902. This provides for a tight friction fit of the side arms 1908 onto the panel 1902 when pressed or positioned thereon.

A conventional BGA 120 is disposed on the surface of the substrate 204 opposite the heat spreader 1900.

Figure 20:
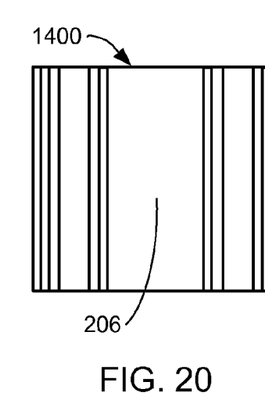
FIG. 20 is a top view of the heat spreader of FIG. 14.

Referring now to FIG. 20, therein is shown a top view of the heat spreader 1400 (FIG. 14).

Figure 21:
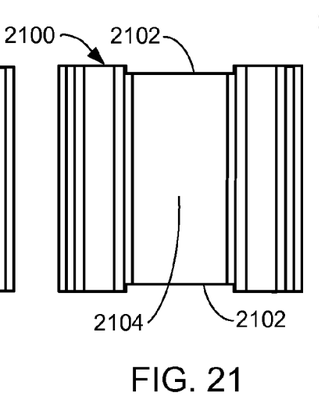
FIG. 21 is a top view of a heat spreader, similar to the heat spreader of FIG. 20, with notches on the ends of the panel.
Figure 28:
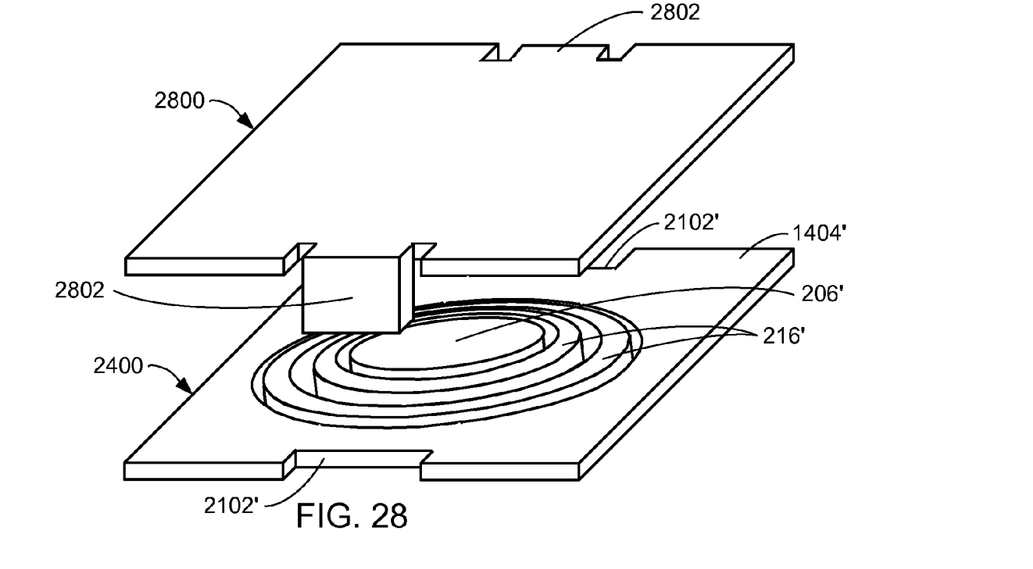
FIG. 28 is an isometric view of the heat spreader shown in FIGS. 26 and 27, including an auxiliary heat spreader thereabove.

Referring now to FIG. 21, therein is shown a top view of a heat spreader 2100 similar to the heat spreader 1400 as illustrated in FIG. 20, but including notches 2102 on the ends of the panel 2104 thereof. The notches 2102 provide for ventilation or for interlocking with an auxiliary heat spreader such as the auxiliary heat spreader 2800 (FIG. 28).

Figure 22:
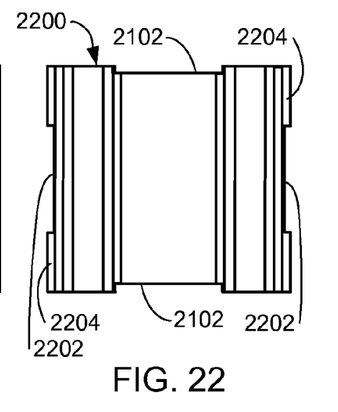
FIG. 22 is a top view of a heat spreader, similar to the heat spreader of FIG. 20, with slots in the side ledges thereof.

Referring now to FIG. 22, therein is shown a top view of a heat spreader 2200 similar to the heat spreader 2100 as illustrated in FIG. 21, but including slots 2202 formed in the side ledges 2204 thereof. The slots 2202 provide for additional ventilation or additional interlocking with an auxiliary heat spreader. The notches 2102 and slots 2202 can be readily formed using conventional manufacturing processes such as, for example, blanking and/or bending.

Figure 23:
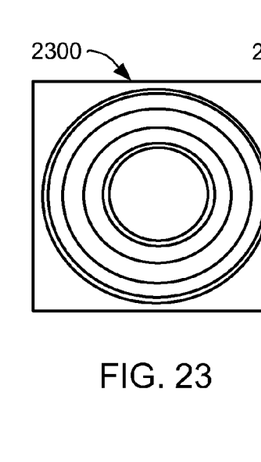
FIG. 23 is a top view of a heat spreader having a circular rather than linear configuration for the stand-off feet.

Referring now to FIG. 23, therein is shown a top view of a heat spreader 2300 having a circular rather than linear configuration for the stand-off feet. As described in greater detail in connection with FIGS. 24, 26, and 27, the heat spreader 2300 has a cross-sectional profile similar to that of the heat spreader 1400 (FIGS. 14 and 20), and thus provides similar features and functionality. In additional, since the semiconductor package channel (see 208' in FIG. 27) is circularly closed, it forms an excellent one-piece, low-cost EMI shield. The heat spreader 2300 can be readily formed using conventional manufacturing processes such as, for example, stamping, coining, milling, molding, and/or etching.

Figure 24:
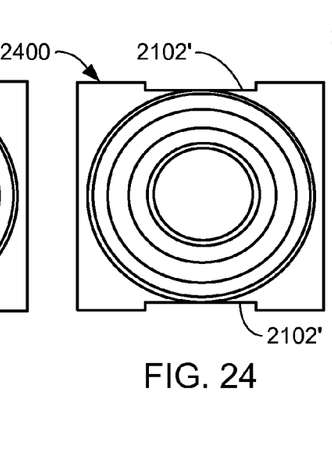
FIG. 24 is a top view of a heat spreader similar to the heat spreader illustrated in FIG. 23, but including notches therein.

Referring now to FIG. 24, therein is shown a top view of a heat spreader 2400 similar to the heat spreader 2300 as illustrated in FIG. 23, but including notches 2102' formed therein similar to the notches 2102 in the heat spreader 2100 (FIG. 21).

Figure 25:
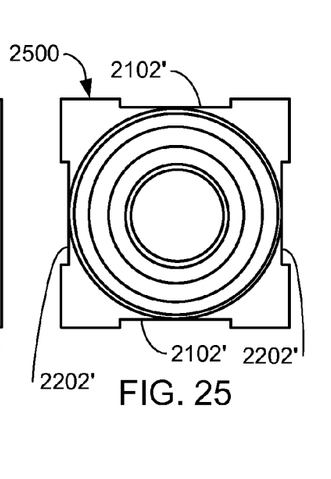
FIG. 25 is a top view of a heat spreader similar to the heat spreader illustrated in FIG. 24, but including slots therein.

Referring now to FIG. 25, therein is shown a top view of a heat spreader 2500 similar to the heat spreader 2400 as illustrated in FIG. 24, but including slots 2202' formed therein similar to the slots 2202 in the heat spreader 2200 (FIG. 22).

Figure 26:
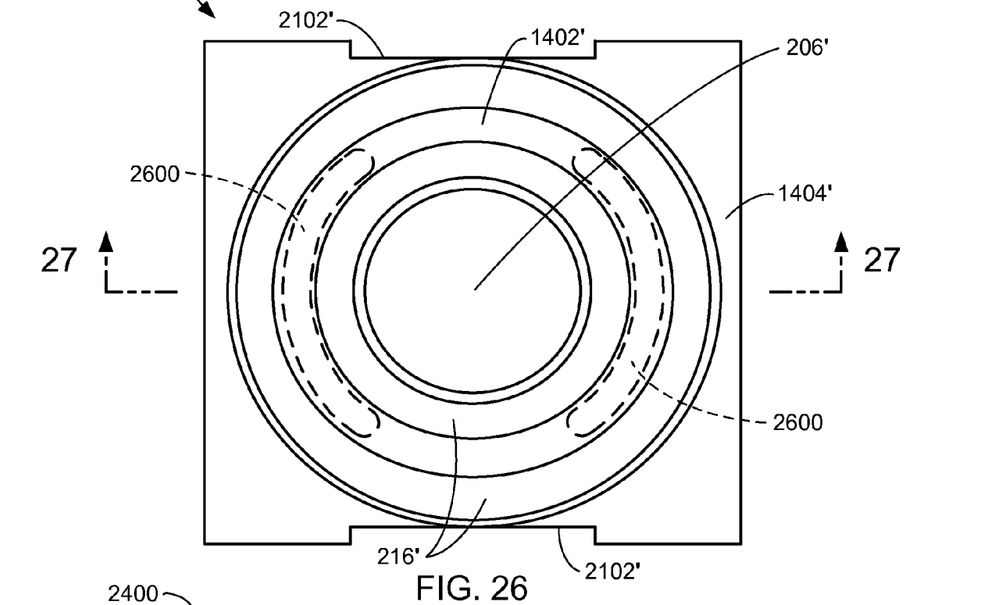
FIG. 26 is an enlarged top view of the heat spreader shown in FIG. 24.
Figure 27:
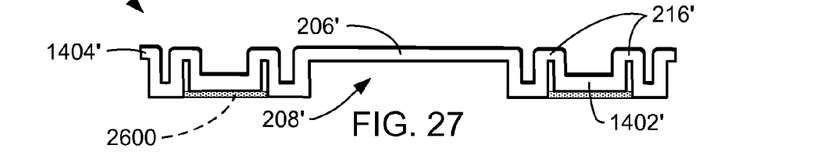
FIG. 27 is a cross-sectional view of the heat spreader shown in FIG. 26, taken on line 27-27 therein.

Referring now to FIG. 26, therein is shown an enlarged top view of the heat spreader 2400 shown in FIG. 24. Although having a circular configuration, the heat spreader 2400 has a cross-sectional profile and functional features similar to that of the heat spreader 1400 (FIG. 14), as can be seen in FIG. 27. Features and elements analogous to those in FIG. 14 therefore have the same reference numbers primed, and will be understood to be similarly described by reference to their unprimed counterparts (FIG. 14).

Also shown in FIG. 26 is an arc-dispensed adhesive 2600, dispensed into the space beneath the stand-off foot 1402'.

Referring now to FIG. 27, therein is shown a cross-sectional view of the heat spreader 2400 shown in FIG. 26, taken on line 27-27 therein. As can be seen herein, the stand-off foot 1402' has a set height to accommodate the arc-dispensed adhesive 2600.

Referring now to FIG. 28, therein is shown an isometric view of the heat spreader 2400 shown in FIGS. 26 and 27. Also shown is an auxiliary heat spreader 2800 that has tabs 2802 that are dimensioned to match and mechanically interlock with the notches 2102' when the auxiliary heat spreader 2800 is positioned on top of the heat spreader 2400. When thus positioned, the tabs 2802 may be bent inwardly to secure the auxiliary heat spreader 2800 on top of the heat spreader 2400

It will be understood, of course, that similar circular pattern adaptations of other linear configurations, as disclosed above, may also be made as desired or appropriate.

Figure 29:
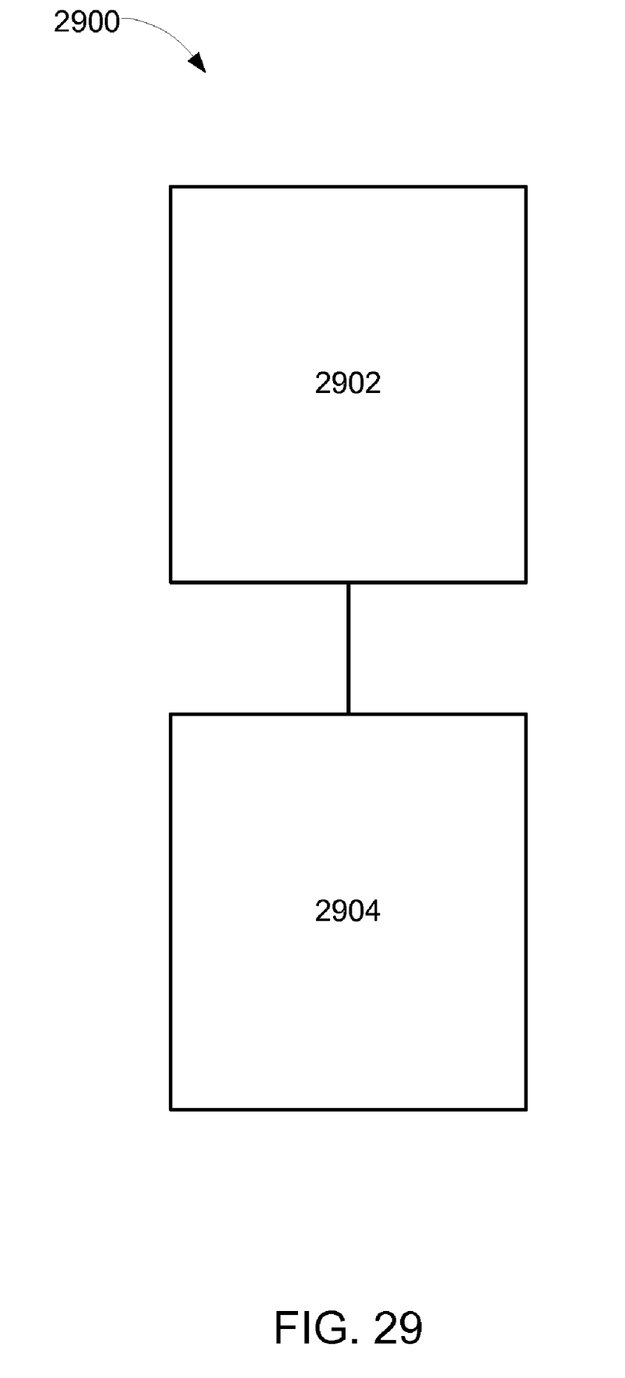
FIG. 29 is a flow chart of a method for fabricating a semiconductor heat spreader in accordance with the present invention.

Referring now to FIG. 29, therein is shown a flow chart of a method 2900 for fabricating a semiconductor heat spreader in accordance with the present invention. The method 2900 includes providing a unitary metallic plate in a block 2902; and, in a block 2904; forming the unitary metallic plate into a panel, channel walls depending from the panel to define a channel between the channel walls and the panel for receiving a semiconductor therein; at least two feet extending from respective channel walls for attachment to a substrate, and at least one external reversing bend.

Thus, it has been discovered that the heat spreaders and the semiconductor heat spreader fabrication methods of the present invention furnish important and heretofore unavailable solutions, capabilities, and functional advantages for meeting the needs for heat management and heat dissipation in semiconductor packages.

One important advantage is that the heat spreaders are formed from and as a single metallic plate, in a single metal stamping and forming process. This is a significant improvement over prior heat spreaders that required formation and assembly of multiple components, sometimes involving significant machining operations.

Another advantage of the present invention is provided by the symmetry, along one axis, that enables the heat spreaders to be formed in continuous shaping and/or extruding operations.

Still another advantage is the great versatility in configurations and shapes that is made possible by the present invention.

Another advantage is that the heat spreaders are highly versatile and customizable according to particular needs and applications.

Still another advantage of the present invention is the economy and efficiency with which the optional auxiliary heat spreaders can be fabricated, also in a single metal stamping and forming process, from a single, unitary piece or plate of metallic material. The auxiliary heat spreaders themselves are highly versatile: they can serve, for example, as just a top cover, as an EMI shield, or as an active part of the heat spreader itself. In either case, not only are the auxiliary heat spreaders easily and inexpensively fabricated, but they can be just as readily and inexpensively attached onto the heat spreaders. The attachment of the auxiliary heat spreaders, such as by the several tab and/or snap configurations disclosed herein, is particularly efficient, effective, and economical.

Another advantage of the present invention is that the thermal adhesive can be efficiently and very effectively applied through fast, inexpensive line dispensing. This not only affords an economical, highly reliable, and effective bond of the heat spreader to the substrate, but it also affords enhanced thermal conductivity in the interface between the heat spreader and the substrate.

Still another advantage of the present invention is that the thermal and bonding interface between the heat spreader and the substrate may alternatively be provided by dispensing the thermal adhesive in large-size dots, thereby providing higher UPH.

The resulting processes and configurations are thus straightforward, economical, uncomplicated, highly versatile and effective, use existing technologies, and are thus readily suited for economically and effectively manufacturing semiconductor heat spreader devices using conventional manufacturing processes and technologies. The present invention thus takes heat spreader technology to the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A semiconductor heat spreader comprising a unitary metallic plate having:
   a substrate;
   a panel over the substrate;
   channel walls depending from the panel to define a semiconductor receiving channel between the channel walls and the panel, the semiconductor receiving channel extending from an end of the substrate to an opposite end of the substrate;
   at least two feet extending from the channel walls for attachment to the substrate; and
   at least one external reversing bend.

2. The semiconductor heat spreader of claim 1 wherein the feet are selected from an arched foot, a stand-off foot, a slotted stand-off foot, a toed foot, a stand-off toed foot, a flat foot, a slotted flat foot, a zigzag foot, a box foot, and a combination thereof.

3. The semiconductor heat spreader of claim 1 wherein the feet are formed to accommodate respective set volumes of adhesive therebeneath for attaching the semiconductor heat spreader to the substrate.

4. The semiconductor heat spreader of claim 1 further comprising an electromagnetic interference shield for the channel.

5. The semiconductor heat spreader of claim 1 further comprising an additional unitary metallic plate configured as a unitary auxiliary heat spreader for attachment on top of the semiconductor heat spreader.

6. The semiconductor heat spreader of claim 5 further comprising attachment means for attaching the unitary auxiliary heat spreader to the semiconductor heat spreader, the attachment means being selected from tabs, locking tabs, deformable sides, side ledges, side clips, clip bosses, center clips, side arms, and a combination thereof.

7. The semiconductor heat spreader of claim 1 further comprising an integral auxiliary heat spreader formed from the unitary metallic plate, located on top of the panel, and having the physical characteristics of being formed in a unitary metal forming process.

8. The semiconductor heat spreader of claim 1 wherein the unitary metallic plate has the physical characteristics of being formed in a unitary metal forming process and a cross-sectional profile that is substantially constant in at least one horizontal direction.

9. A semiconductor heat spreader comprising a unitary metallic plate having:
   a substrate;
   a panel over the substrate;
   channel walls depending from opposite sides of the panel to define a semiconductor receiving channel between the channel walls and the panel, the semiconductor receiving channel extending from an end of the substrate to an opposite end of the substrate;
   at least two feet extending from the channel walls on opposite sides of the panel for attachment to the substrate, the feet being:
      selected from an arched foot, a stand-off foot, a slotted stand-off foot, a toed foot, a stand-off toed foot, a flat foot, a slotted flat foot, a zigzag foot, a box foot, and a combination thereof; and
      formed to accommodate respective set volumes of adhesive therebeneath for attaching the semiconductor heat spreader to the substrate;
   a cross-sectional profile that is substantially constant in at least one horizontal direction;
   the physical characteristics of being formed in a unitary metal forming process; and
   at least one external reversing bend.

10. The semiconductor heat spreader of claim 9 further comprising:
   an additional unitary metallic plate configured as a unitary auxiliary heat spreader for attachment on top of the semiconductor heat spreader and having the physical characteristics of being formed in a unitary metal forming process; and
   attachment means for attaching the unitary auxiliary heat spreader to the semiconductor heat spreader, the attachment means being selected from tabs, locking tabs, deformable sides, side ledges, side clips, clip bosses, center clips, side arms, and a combination thereof.

* * * * *

UNITED STATES PATENT AND TRADEMARK OFFICE
CERTIFICATE OF CORRECTION

PATENT NO.        : 8,207,598 B2
APPLICATION NO.   : 12/498163
DATED             : June 26, 2012
INVENTOR(S)       : Ararao et al.

Page 1 of 1

It is certified that error appears in the above-identified patent and that said Letters Patent is hereby corrected as shown below:

IN THE SPECIFICATIONS:

Column 7:
line 38, delete "to FIG. 1, therein" and insert therefor --to FIG. 11, therein--

Signed and Sealed this
Sixteenth Day of October, 2012

David J. Kappos
*Director of the United States Patent and Trademark Office*